United States Patent
Masui et al.

(10) Patent No.: US 9,926,647 B2
(45) Date of Patent: Mar. 27, 2018

(54) METHOD FOR PRODUCING β-GA₂O₃ SUBSTRATE AND METHOD FOR PRODUCING CRYSTAL LAMINATE STRUCTURE INCLUDING CUTTING OUT β-GA₂O₃ BASED SUBSTRATE FROM β-GA₂O₃ BASED CRYSTAL

(71) Applicants: TAMURA CORPORATION, Tokyo (JP); KOHA CO., LTD., Tokyo (JP)

(72) Inventors: Takekazu Masui, Tokyo (JP); Yu Yamaoka, Tokyo (JP)

(73) Assignees: TAMURA CORPORATION, Tokyo (JP); KOHA CO., LTD., Tokyo (JP)

( * ) Notice: Subject to any disclaimer, the term of this patent is extended or adjusted under 35 U.S.C. 154(b) by 392 days.

(21) Appl. No.: 14/351,817

(22) PCT Filed: Oct. 12, 2012

(86) PCT No.: PCT/JP2012/076523
§ 371 (c)(1),
(2) Date: Apr. 14, 2014

(87) PCT Pub. No.: WO2013/054919
PCT Pub. Date: Apr. 18, 2013

(65) Prior Publication Data
US 2014/0230723 A1 Aug. 21, 2014

(30) Foreign Application Priority Data
Oct. 14, 2011 (JP) .................................. 2011-226554

(51) Int. Cl.
*C30B 33/02* (2006.01)
*C30B 25/18* (2006.01)
(Continued)

(52) U.S. Cl.
CPC ............ *C30B 25/186* (2013.01); *C30B 29/16* (2013.01); *C30B 33/02* (2013.01);
(Continued)

(58) Field of Classification Search
CPC .. C30B 1/00; C30B 1/02; C30B 25/00; C30B 25/02; C30B 25/10; C30B 25/16;
(Continued)

(56) References Cited

U.S. PATENT DOCUMENTS

2003/0107098 A1 6/2003 Ota et al.
2006/0223287 A1* 10/2006 Ushida .................... C30B 25/02
438/483
(Continued)

FOREIGN PATENT DOCUMENTS

JP 2002-93243 A 3/2002
JP 2005-235961 A 9/2005
(Continued)

OTHER PUBLICATIONS

Japanese Office Action dated Feb. 10, 2015 with a partial English Translation thereof.
(Continued)

*Primary Examiner* — Kenneth A Bratland, Jr.
(74) *Attorney, Agent, or Firm* — McGinn IP Law Group, PLLC.

(57) ABSTRACT

Provided are: a method for producing a β-Ga₂O₃ substrate of which changes in donor concentration in a reducing atmosphere or an inert gas atmosphere are suppressed; and a method for producing a crystal laminate structure that can epitaxially grow a high-quality crystal film having low variability of quality in a reducing atmosphere or an inert gas atmosphere. The method for producing a β-Ga₂O₃ substrate includes a step for cutting out a β-Ga₂O₃ substrate from a β-Ga₂O₃ crystal containing a group IV element; annealing
(Continued)

processing in an atmosphere containing a reducing atmosphere and/or an inert gas atmosphere is performed on the β-Ga$_2$O$_3$ crystal before cutting out the β-Ga$_2$O$_3$ substrate, or on the cut-out β-Ga$_2$O$_3$ substrate.

13 Claims, 6 Drawing Sheets

(51) Int. Cl.
*C30B 29/16* (2006.01)
*H01L 21/02* (2006.01)

(52) U.S. Cl.
CPC .... *H01L 21/0262* (2013.01); *H01L 21/02414* (2013.01); *H01L 21/02565* (2013.01)

(58) Field of Classification Search
CPC ....... C30B 25/18; C30B 25/186; C30B 29/00; C30B 29/10; C30B 29/16; C30B 33/00; C30B 33/02; H01L 21/02414; H01L 21/02565; H01L 21/0262
USPC ....... 117/3–4, 7, 9, 84–85, 88, 94, 106, 937, 117/944
See application file for complete search history.

(56) References Cited

U.S. PATENT DOCUMENTS

2006/0289860 A1* 12/2006 Ichinose ................. C30B 25/02
257/43

2007/0166967 A1* 7/2007 Ichinose ................. C30B 13/00
438/510

2012/0003770 A1 1/2012 Hashimoto et al.

FOREIGN PATENT DOCUMENTS

| JP | 2005-239517 A | | 9/2005 |
|---|---|---|---|
| JP | 2006-117464 A | | 5/2006 |
| JP | 2007-254174 A | | 10/2007 |
| JP | 2008-156141 | * | 7/2008 |
| JP | 2008-156141 A | | 7/2008 |
| WO | WO 2010/095550 A1 | | 8/2010 |

OTHER PUBLICATIONS

Partial Extended European Search Report (English-Language version) dated Jan. 23, 2015.
"Synthesis and Control of Conductivity of Ultraviolet Transmitting [beta]-Ga$_2$O$_3$ Single Crystals", Applied Physics Letters, American Institute of Physics, US, vol. 70, No. 26, Jun. 30, 1997, pp. 3561-3563.
Takakura K et al: "Optical Property and Crystalline Quarity of Se and Ge Added B-Ga$_2$O$_3$ Thin Films", Journal of Materials Science: Materials in Electronics, Kluwer Academic Publishers, Bo, col. 19, No. 2, Jun. 15, 2007. pp. 167-170.
International Search Report dated Dec. 11, 2012 in PCT/JP2012/076523 (English version).
Chinese Office Action dated Sep. 5, 2016 and English translation thereof.
Encarnación G. Villora, et al. "Electrical conductivity and carrier concentration control in β-Ga$_2$O$_3$ by Si doping", Applied Physics Letters, vol. 92, 202120-1-202120-3, 2008.

* cited by examiner

METHOD FOR PRODUCING β-GA₂O₃ SUBSTRATE AND METHOD FOR PRODUCING CRYSTAL LAMINATE STRUCTURE INCLUDING CUTTING OUT β-GA₂O₃ BASED SUBSTRATE FROM β-GA₂O₃ BASED CRYSTAL

TECHNICAL FIELD

The invention relates to a method for producing $\beta$-$Ga_2O_3$ based substrate (herein a $\beta$-$Ga_2O_3$ substrate) and a method for producing a crystal laminate structure (or laminated crystal structure).

BACKGROUND ART

A method of controlling electrical resistivity of a $\beta$-$Ga_2O_3$ substrate by implanting a dopant such as Si is known (see e.g. PTL 1).

CITATION LIST

Patent Literature

[PTL 1]
JP-A-2005-235961

SUMMARY OF INVENTION

Technical Problem

However, when the $\beta$-$Ga_2O_3$ substrate containing a dopant is exposed to a reduction atmosphere or an inert gas atmosphere for, e.g., epitaxial crystal growth by a MOCVD (Metal Organic Chemical Vapor Deposition) method, there is a possibility that the substrate per se is reduced, causing an increase in donor concentration.

In addition, the increase in donor concentration causes change in light absorption properties mainly in a region on a long-wavelength side with respect to the near-infrared, which results in that temperature of the $\beta$-$Ga_2O_3$ substrate changes during epitaxial growth when a crystal is epitaxially grown by a method using radiation to heat, such as MOCVD. For epitaxial crystal growth, temperature of substrate is a very important parameter which affects crystal quality. Therefore, when temperature characteristics vary in accordance with variation in light absorption properties of the substrate, quality of crystal to be grown may vary.

It is an object of the invention to provide a method for producing a $\beta$-$Ga_2O_3$ substrate which suppresses a change in donor concentration in a reduction atmosphere or an inert gas atmosphere, as well as a method for producing a crystal laminate structure which can epitaxially grow a high-quality crystal film having low variability of quality in a reduction atmosphere or an inert gas atmosphere.

Solution to Problem

According to one embodiment of the invention, a method for producing a $\beta$-$Ga_2O_3$ based substrate as defined in [1] to [4] below and a method for manufacturing a crystal laminate structure as defined in [5] to [8] below are provided so as to achieve one of the above object.

[1] A method for producing a $\beta$-$Ga_2O_3$ based substrate, comprising a step for cutting out a $\beta$-$Ga_2O_3$ based substrate from a $\beta$-$Ga_2O_3$ based crystal containing a group IV element, wherein annealing processing in an atmosphere comprising at least one of a reduction atmosphere and an inert gas atmosphere is performed on the $\beta$-$Ga_2O_3$ based crystal before cutting out the $\beta$-$Ga_2O_3$ based substrate or on the $\beta$-$Ga_2O_3$ based substrate.

[2] The method for producing a $\beta$-$Ga_2O_3$ based substrate according to [1], wherein the reduction atmosphere comprises an $H_2$ atmosphere.

[3] The method for producing a $\beta$-$Ga_2O_3$ based substrate according to [1] or [2], wherein the inert gas atmosphere comprises at least one of a $N_2$ atmosphere, an Ar atmosphere, a Ne atmosphere and a He atmosphere.

[4] The method for producing a $\beta$-$Ga_2O_3$ based substrate according to [1] or [2], wherein the group IV element comprises Si.

[5] A method for producing a crystal laminate structure, comprising:
a step for cutting out a $\beta$-$Ga_2O_3$ based substrate from a $\beta$-$Ga_2O_3$ based crystal containing a group IV element; and
a step for epitaxially growing a crystal film on the $\beta$-$Ga_2O_3$ based substrate in a first atmosphere comprising at least one of a first reduction atmosphere and a first inert gas atmosphere,
wherein annealing processing in a second atmosphere comprising at least one of a second reduction atmosphere and a second inert gas atmosphere is performed on the $\beta$-$Ga_2O_3$ based crystal before cutting out the $\beta$-$Ga_2O_3$ based substrate or on the $\beta$-$Ga_2O_3$ based substrate before epitaxially growing the crystal film.

[6] The method for producing a crystal laminate structure according to [5], wherein the first and second reduction atmospheres comprise an $H_2$ atmosphere.

[7] The method for producing a crystal laminate structure according to [5] or [6], wherein the first and second inert gas atmospheres comprise at least one of a $N_2$ atmosphere, an Ar atmosphere, a Ne atmosphere and a He atmosphere.

[8] The method for producing a crystal laminate structure according to [5] or [6], wherein the group IV element comprises Si.

Advantageous Effects of Invention

According to one embodiment of the invention, a method for producing a $\beta$-$Ga_2O_3$ substrate can be provided which suppresses a change in donor concentration in a reduction atmosphere or an inert gas atmosphere, as well as a method for producing a crystal laminate structure which can epitaxially grow a high-quality crystal film having low variability of quality in a reduction atmosphere or an inert gas atmosphere.

DESCRIPTION OF EMBODIMENTS

[Embodiment]

One of the essential points of the present embodiment is that a donor concentration in a β-$Ga_2O_3$ substrate is preliminarily increased prior to a process performed in an atmosphere including at least one of a reduction atmosphere and an inert gas atmosphere, e.g., epitaxial crystal growth on the β-$Ga_2O_3$ substrate, to solve problems caused by an increase in a donor concentration during such a process. A specific example of the embodiment will be described below.

(Manufacture of β-$Ga_2O_3$ substrate)

Manufacture of a β-$Ga_2O_3$ substrate will be described below. Since gallium oxide is transparent and conductive, the β-$Ga_2O_3$ substrate is useful as a substrate of a light-emitting element having a vertical electrode structure and has attracted attention in recent years.

Firstly, a β-$Ga_2O_3$ crystal containing Si as a dopant is formed by a crystal growth method such as EFG (Edge-defined film-fed growth) method or FZ (Floating Zone) method. The Si concentration in the β-$Ga_2O_3$ crystal is controlled according to the desired electrical resistivity of the β-$Ga_2O_3$ substrate.

In case that the β-$Ga_2O_3$ crystal is grown by the EFG method, for example, $Ga_2O_3$ powder and $SiO_2$ powder which is a Si material as a dopant are melted and the resulting melt is drawn up using a seed crystal to grow a crystal, thereby obtaining a plate-like β-$Ga_2O_3$ crystal. In case of using the FZ method, for example, a feed rod made of $Ga_2O_3$ powder and $SiO_2$ powder which is a Si material as a dopant is vertically held and is partially heated to make a molten zone, and a crystal is grown by moving the molten zone upward or downward while holding by surface tension, thereby obtaining a column-shaped β-$Ga_2O_3$ crystal.

The β-$Ga_2O_3$ crystal is a β-$Ga_2O_3$ single crystal or a β-$Ga_2O_3$ single crystal with an element such as Al or In added thereto, and contains Si as a dopant.

At this stage, the donor concentration is often lower than the Si concentration in the grown β-$Ga_2O_3$ crystal and the donor concentration with respect to the Si concentration varies depending on the grown crystal. Thus, the grown β-$Ga_2O_3$ crystal is subjected to annealing processing in an atmosphere including at least one of a reduction atmosphere and an inert gas atmosphere to bring the donor concentration in the grown β-$Ga_2O_3$ crystal close to the Si concentration in the grown β-$Ga_2O_3$ crystal, thereby reducing variation in the donor concentration with respect to the Si concentration.

The reduction atmosphere used for this annealing processing is, e.g., a $H_2$ atmosphere. Meanwhile, the inert gas atmosphere is, e.g., a $N_2$ atmosphere, an Ar atmosphere, a Ne atmosphere, a He atmosphere or a mixed atmosphere including two or more thereof. Annealing treatment temperature is, e.g., not less than 800° C. and not more than 1725° C. which is a melting point of gallium oxide.

Figure 1:
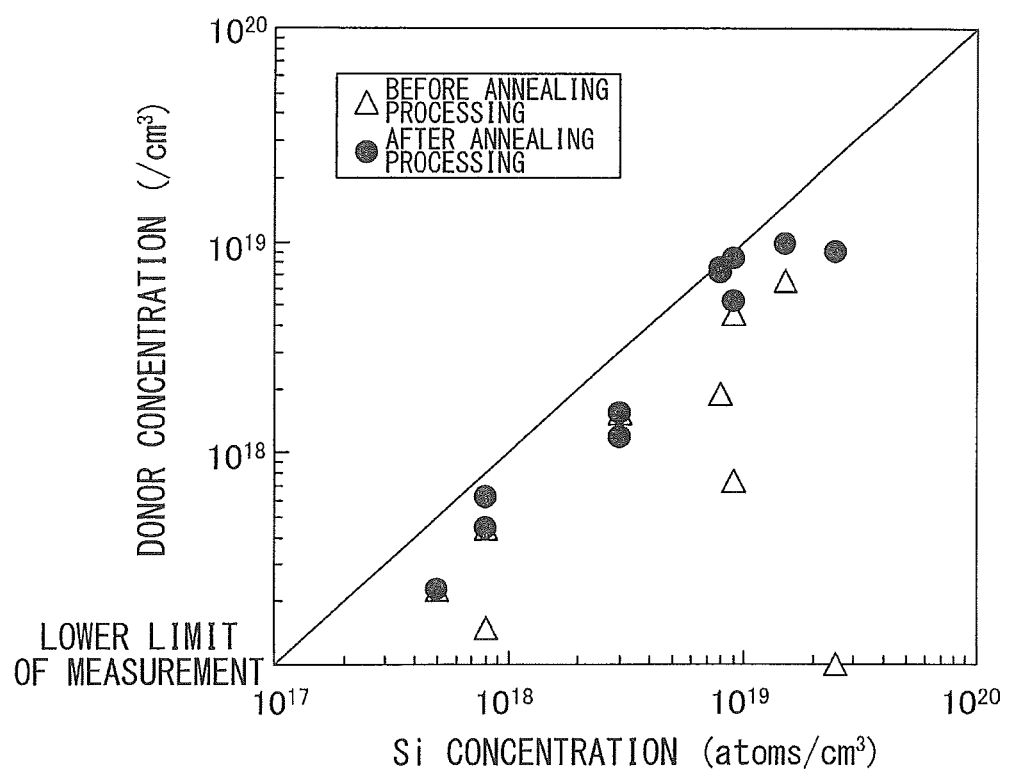
FIG. 1 is a graph showing a relation between a Si concentration and a donor concentration in a $\beta$-$Ga_2O_3$ crystal (herein a $\beta$-$Ga_2O_3$ based crystal) before and after annealing processing.

FIG. 1 is a graph showing a relation between a Si concentration and a donor concentration in a β-$Ga_2O_3$ crystal before and after the above-mentioned annealing processing. In FIG. 1, the vertical axis indicates a donor concentration (/$cm^3$) and the horizontal axis indicates a Si concentration ($atoms/cm^3$). Open triangles and filled circles in FIG. 1 respectively indicate measured values before annealing processing and those after annealing processing.

To obtain the measured values shown in FIG. 1, plural β-$Ga_2O_3$ crystals having different Si concentrations were prepared and a donor concentration of each crystal was measured before and after annealing processing. In the annealing processing, the temperature was increased to 1000° C. in 19 minutes in an atmosphere consisting 100% of $N_2$, was then kept at 1000° C. for 1 hour and was lowered to room temperature in 19 minutes. Here, the donor concentration was measured using a C—V measurement device and the Si concentration was measured by SIMS analysis.

Before annealing processing, some β-$Ga_2O_3$ crystals have a large difference between the Si concentration and the donor concentration and the donor concentration with respect to the Si concentration varies greatly, as shown in FIG. 1. On the other hand, after annealing processing, the donor concentration is close to the Si concentration in all β-$Ga_2O_3$ crystals and variation in the donor concentration with respect to the Si concentration is reduced.

After that, a β-$Ga_2O_3$ substrate is cut out from the plate-like or column-shaped β-$Ga_2O_3$ crystal. It should be noted that the above-mentioned annealing processing may be performed after a β-$Ga_2O_3$ substrate is cut out from the O-$Ga_2O_3$ crystal. Alternatively, the above-mentioned annealing processing may be performed on a β-$Ga_2O_3$ substrate after a polishing process.

In the β-$Ga_2O_3$ crystal, the donor concentration correlates with light absorption properties in a region on a long-wavelength side with respect to the near-infrared. Therefore, when each β-$Ga_2O_3$ crystal has a significantly different donor concentration, light absorption properties thereof are also significantly different. In such a case, substrate temperature during crystal growth is different in each substrate when, for example, a crystal film is epitaxially grown on the β-$Ga_2O_3$ substrate cut out from the β-$Ga_2O_3$ crystal and this may cause variation in quality of an epitaxial crystal film.

Figure 2:
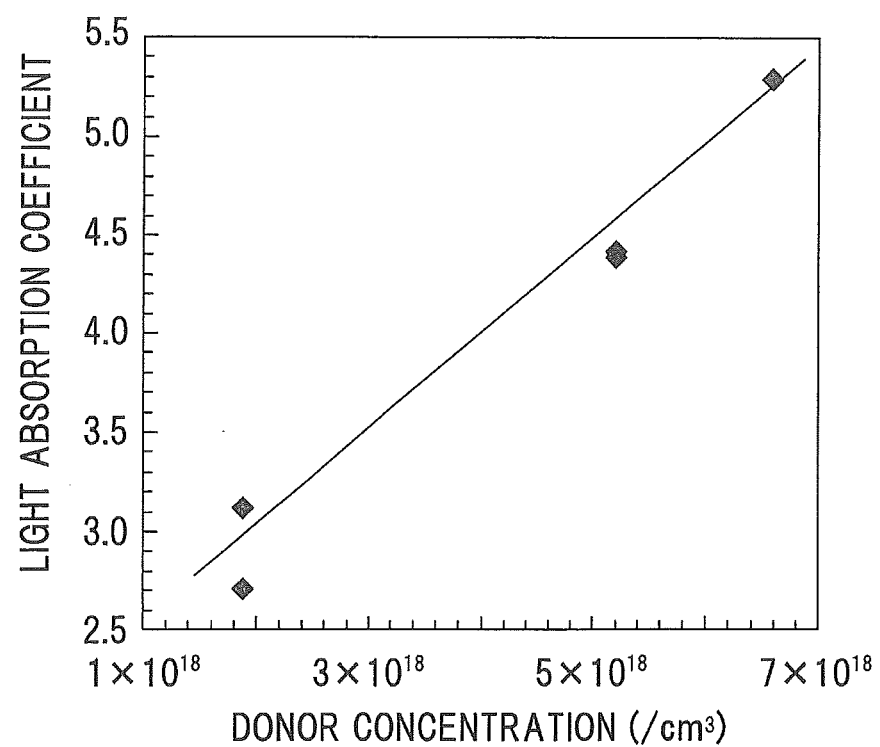
FIG. 2 is a graph showing a relation between a donor concentration and light absorption properties of a $\beta$-$Ga_2O_3$ substrate.

FIG. 2 is a graph showing a relation between a donor concentration and light absorption properties of a β-$Ga_2O_3$ substrate. In FIG. 2, the vertical axis indicates light absorption coefficient of theβ-$Ga_2O_3$ substrate at a wavelength of 750 nm and the horizontal axis indicates a donor concentration (/$cm^3$).

In the β-$Ga_2O_3$ substrate, the donor concentration is substantially proportional to the light absorption coefficient at a wavelength of 750 nm as shown in FIG. 2, and the light absorption coefficient increases with an increase in the donor concentration.

(Manufacture of Crystal Laminate Structure)

The β-$Ga_2O_3$ substrate is formed and a crystal film is subsequently epitaxially grown on the β-$Ga_2O_3$ substrate, thereby forming a crystal laminate structure including the β-$Ga_2O_3$ substrate and an epitaxial crystal film.

For example, a GaN-based crystal film is epitaxially grown on the β-$Ga_2O_3$ substrate by the MOCVD method. In the MOCVD method, a crystal grows in a reduction atmosphere such as hydrogen atmosphere, ammonia atmosphere or a mixed atmosphere of hydrogen and ammonia. In the present embodiment, the substrate temperature during crystal growth hardly changes since the donor concentration in the β-$Ga_2O_3$ substrate is preliminarily increased by the above-mentioned annealing processing and it is thus possible to form a high-quality epitaxial crystal film with less variation in quality.

Figure 3:
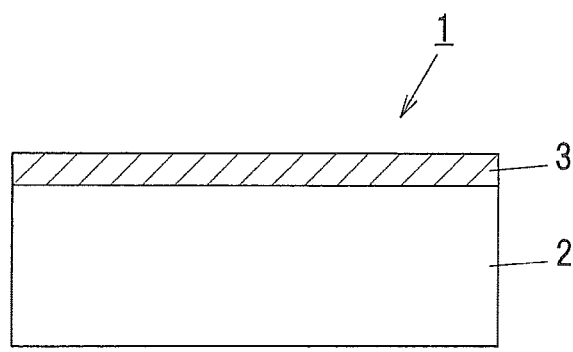
FIG. 3 is a vertical cross sectional view showing an example of a crystal laminate structure.

FIG. 3 is a vertical cross sectional view showing an example of a crystal laminate structure in the present embodiment. A crystal laminate structure 1 has a β-Ga$_2$O$_3$ based crystal film 2 and an epitaxial crystal film 3 on the β-Ga$_2$O$_3$ crystal film 2.

Figure 4:
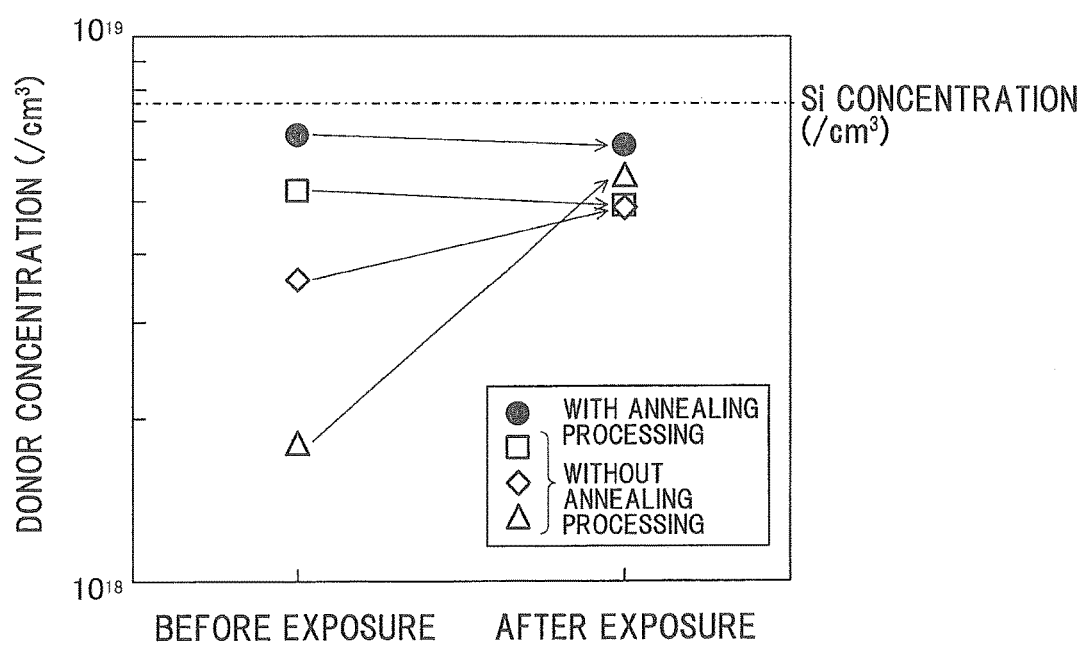
FIG. 4 is a graph showing variation in the donor concentration in $\beta$-$Ga_2O_3$ substrates with and without annealing processing and before and after epitaxial crystal growth.

FIG. 4 is a graph showing variation in the donor concentration in β-Ga$_2$O$_3$ substrates with and without annealing processing and before and after exposure to epitaxial crystal growth atmosphere. In FIG. 4, the vertical axis indicates a donor concentration (/cm$^3$), the left side of the horizontal axis indicates before exposure to epitaxial crystal growth atmosphere and the right side of the horizontal axis indicates after exposure to epitaxial crystal growth atmosphere. In FIG. 4, filled circles are measured values of an annealed β-Ga$_2$O$_3$ substrate in the present embodiment, and open triangles, open diamonds and open squares are measured values of non-annealed β-Ga$_2$O$_3$ substrates.

To obtain the measured values shown in FIG. 4, one β-Ga$_2$O$_3$ substrate obtained from an annealed β-Ga$_2$O$_3$ crystal and three β-Ga$_2$O$_3$ substrates obtained from on-annealed β-Ga$_2$O$_3$ crystals were prepared and a donor concentration of each substrate was measured before and after exposure to epitaxial crystal growth atmosphere. All of the four β-Ga$_2$O$_3$ substrates have a Si concentration of about $7.5 \times 10^{18}$/cm$^3$. In the annealing processing performed on the one β-Ga$_2$O$_3$ crystal, the temperature was increased to 1450° C. in 9 hours in a N$_2$ atmosphere, was then kept at 1450° C. for 6 hours and was lowered to room temperature in 12 hours.

As shown in FIG. 4, the donor concentration in the annealed β-Ga$_2$O$_3$ substrate hardly changes before and after exposure to epitaxial crystal growth atmosphere. This is because the donor concentration in the β-Ga$_2$O$_3$ substrate is preliminarily increased by annealing processing and is close to the Si concentration in the β-Ga$_2$O$_3$ substrate.

On the other hand, the donor concentration before epitaxial crystal growth is significantly different between the non-annealed β-Ga$_2$O$_3$ substrates and, in the substrates having a low donor concentration, the donor concentration increases toward the Si concentration from before to after exposure to epitaxial crystal growth atmosphere. Due to significant difference in the donor concentration before exposure to epitaxial crystal growth atmosphere, the degree of change in substrate temperature during crystal growth is different in each substrate and quality of epitaxially-grown crystal is likely to be different in each substrate.

Figure 5A:
FIG. 5A is a photograph showing a state of an annealed β-$Ga_2O_3$ substrate after epitaxial crystal growth.
Figure 5B:
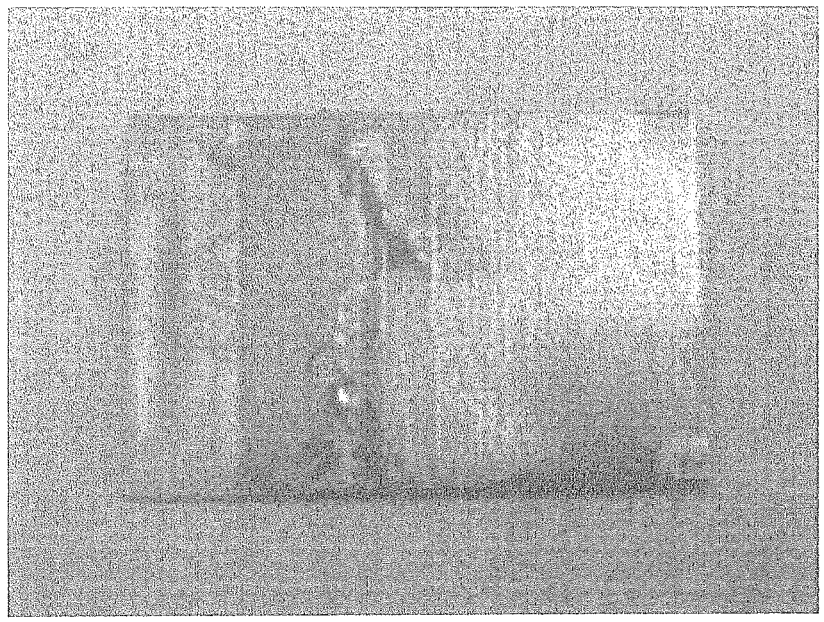
FIG. 5B is a photograph showing a state of a non-annealed β-$Ga_2O_3$ substrate after epitaxial crystal growth.

FIG. 5A is a photograph showing a state of the annealed β-Ga$_2$O$_3$ substrate after epitaxial crystal growth and FIG. 5B is a photograph showing a state of the non-annealed β-Ga$_2$O$_3$ substrate after epitaxial crystal growth. A crystal on aβ-Ga$_2$O$_3$ substrate shown in FIG. 5A and a crystal on β-Ga$_2$O$_3$ substrate shown in FIG. 5B were epitaxially grown under the same conditions.

As shown in FIG. 5B, a crystal film is separated from the non-annealed β-Ga$_2$O$_3$ substrate (in a region on the left side of the substrate). The reason for this is considered that a good quality crystal was not obtained due to change in the substrate temperature during epitaxial crystal growth. On the other hand, the epitaxially-grown film on the annealed β-Ga$_2$O$_3$ substrate is not separated as shown in FIG. 5A and it is shown that a good quality crystal is obtained.

Other than in the case of epitaxial crystal growth, a problem due to variations in the donor concentration and light absorption properties of the β-Ga$_2$O$_3$ substrate may also occur when a process in an atmosphere including at least one of a reduction atmosphere and an inert gas atmosphere is performed on a β-Ga$_2$O$_3$ substrate which is not subjected to the annealing processing of the present embodiment.

(Effects Of The Embodiment)

In the present embodiment, annealing processing in an atmosphere including at least one of a reduction atmosphere and an inert gas atmosphere enables to obtain a β-Ga$_2$O$_3$ substrate in which variation in the donor concentration and resulting variation in light absorption properties in a region on a long-wavelength side with respect to the near-infrared are suppressed.

In addition, in such a β-Ga$_2$O$_3$ substrate, change in the donor concentration in an atmosphere including at least one of a reduction atmosphere and an inert gas atmosphere is small. Thus, when a crystal film is epitaxially grown on the β-Ga$_2$O$_3$ substrate, an epitaxial crystal film with small variation in quality is formed and it is thus possible to obtain a high-quality crystal laminate structure.

Furthermore, other than in the case of epitaxial crystal growth, it is possible to suppress the problem due to variations in the donor concentration and light absorption properties of the β-Ga$_2$O$_3$ substrate also when a process in an atmosphere including at least one of a reduction atmosphere and an inert gas atmosphere is performed on the β-Ga$_2$O$_3$ substrate in the present embodiment. In addition, for example, when a device is formed to include the β-Ga$_2$O$_3$ substrate or the crystal laminate structure in the present embodiment, it is possible to obtain a high-performance device with small variation in electric characteristics and optical characteristics.

Figure 6:
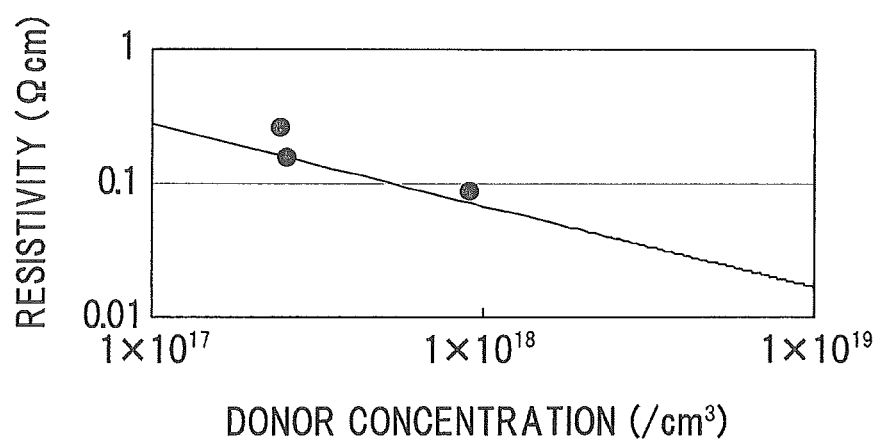
FIG. 6 is a graph showing a relation between a donor concentration and resistivity of the β-$Ga_2O_3$ substrate.

It should be noted that it is possible to control electrical resistance of the β-Ga$_2$O$_3$ substrate by changing the donor concentration. The β-Ga$_2$O$_3$ substrate can be used as a part of current path and thus can be used as a substrate of a light-emitting element having a vertical electrode structure. FIG. 6 is a graph showing a relation between a donor concentration and resistivity of the β-Ga$_2$O$_3$ substrate. The electrical resistivity here is electrical resistivity in a thickness direction which is measured between electrodes respectively connected to front and back sides of the β-Ga$_2$O$_3$ substrate. As shown in FIG. 6, resistivity decreases with an increase in the donor concentration.

Although Si is used as a dopant to a β-Ga$_2$O$_3$ crystal in the above-mentioned embodiment, another group IV element such as Si, Hf, Ge, Sn, Ti or Zr may be used. In addition, two or more types of group IV elements may be used.

Although the embodiment of the invention has been described above, the invention according to claims is not to be limited to the above-mentioned embodiment. Further, it should be noted that all combinations of the features described in the embodiment are not necessary to solve the problem of the invention.

INDUSTRIAL APPLICABILITY

Provided are a method for producing a β-Ga$_2$O$_3$ substrate of which changes in donor concentration in a reduction atmosphere or an inert gas atmosphere are suppressed, and a method for producing a crystal laminate structure which can epitaxially grow a high-quality crystal film having low variability of quality in a reduction atmosphere or an inert gas atmosphere.

Reference Signs List 1 crystal laminate structure
2 Ga$_2$O$_3$ based substrate
3 epitaxial crystal film

The invention claimed is:

1. A method for producing β-$Ga_2O_3$ based substrate, the method comprising cutting out the β-$Ga_2O_3$ based substrate from a β-$Ga_2O_3$ based crystal containing a group IV element,
   wherein an annealing processing in an inert gas atmosphere which does not comprise $H_2$ is performed on the β-$Ga_2O_3$ based crystal before cutting out the β-$Ga_2O_3$ based substrate or on the β-$Ga_2O_3$ based substrate at a temperature of 1,000° C. to 1,725° C. to increase a donor concentration of the β-$Ga_2O_3$ based crystal or the β-$Ga_2O_3$ based substrate which is thereby made approximate to a concentration of the group IV element of the β-$Ga_2O_3$ based crystal or the β-$Ga_2O_3$ based substrate, and
   wherein the annealing processing is performed for suppressing a change of the donor concentration of the β-$Ga_2O_3$ based substrate to suppress a change of substrate temperature, when the β-$Ga_2O_3$ based substrate is placed in a reduction atmosphere or the inert gas atmosphere after the annealing processing.

2. The method for producing a β-$Ga_2O_3$ based substrate according to claim 1, wherein the inert gas atmosphere comprises at least one of a $N_2$ atmosphere, an Ar atmosphere, a Ne atmosphere, and a He atmosphere.

3. The method for producing a β-$Ga_2O_3$ based substrate according to claim 1, wherein the group IV element comprises Si.

4. A method for producing a crystal laminate structure, the method comprising:
   cutting out β-$Ga_2O_3$ based substrate from a β-$Ga_2O_3$ based crystal containing a group IV element; and
   epitaxially growing a crystal film on the β-$Ga_2O_3$ based substrate in a first atmosphere comprising at least one of a first reduction atmosphere and a first inert gas atmosphere,
   wherein an annealing processing in a second inert gas atmosphere which does not comprise $H_2$ is performed on the β-$Ga_2O_3$ based crystal before cutting out the β-$Ga_2O_3$ based substrate at a temperature of 1,000° C. to 1,725° C. to increase a donor concentration of the β-$Ga_2O_3$ based crystal or the β-$Ga_2O_3$ based substrate which is thereby made approximate to a concentration of the group IV element of the β-$Ga_2O_3$ based crystal or the β-$Ga_2O_3$ based substrate, or on the β-$Ga_2O_3$ based substrate before epitaxially growing the crystal film, and
   wherein the annealing processing is performed for suppressing a change of the donor concentration of the β-$Ga_2O_3$ based substrate to suppress a change of substrate temperature and a separation of the crystal film from the β-$Ga_2O_3$ substrate, when the β$Ga_2O_3$ based substrate is placed in the first reduction atmosphere or the first inert gas atmosphere after the annealing processing.

5. The method for producing a crystal laminate structure according to claim 4, wherein the first and second atmospheres comprise at least one of a $N_2$ atmosphere, an Ar atmosphere, a Ne atmosphere and a He atmosphere.

6. The method for producing a crystal laminate structure according to claim 4, wherein the group IV element comprises Si.

7. The method for producing β-$Ga_2O_3$ based substrate according to claim 1, wherein the β-$Ga_2O_3$ based crystal includes a β-$Ga_2O_3$ single crystal.

8. The method for producing a β-$Ga_2O_3$ based substrate according to claim 7, wherein Al or In is added to the β-$Ga_2O_3$ single crystal.

9. The method for producing a β-$Ga_2O_3$ based substrate according to claim 8, wherein the β-$Ga_2O_3$ based crystal includes Si as a dopant.

10. The method for producing a crystal laminate structure according to claim 4, wherein the β-$Ga_2O_3$ based crystal includes a β-$Ga_2O_3$ single crystal.

11. The method for producing a crystal laminate structure according to claim 10, wherein Al or In is added to the β-$Ga_2O_3$ single crystal.

12. The method for producing a crystal laminate structure according to claim 11, wherein the β-$Ga_2O_3$ based crystal includes Si as a dopant.

13. The method for producing a β-$Ga_2O_3$ based substrate according to claim 1, wherein an entirety of the annealing processing is performed in the inert gas atmosphere.

* * * * *